(12) United States Patent
Dale

(10) Patent No.: US 6,807,059 B1
(45) Date of Patent: Oct. 19, 2004

(54) STUD WELDED PIN FIN HEAT SINK

(76) Inventor: James L. Dale, 164 Waterloch Ct., Lawrenceville, GA (US) 30043

(*) Notice: Subject to any disclaimer, the term of this patent is extended or adjusted under 35 U.S.C. 154(b) by 697 days.

(21) Appl. No.: 09/874,636

(22) Filed: Jun. 5, 2001

Related U.S. Application Data

(63) Continuation-in-part of application No. 09/467,777, filed on Dec. 20, 1999, now abandoned.
(60) Provisional application No. 60/114,054, filed on Dec. 28, 1998.

(51) Int. Cl.[7] .................................................. H05K 7/20
(52) U.S. Cl. ...................... 361/703; 361/704; 361/709; 361/710; 257/706; 257/722; 174/16.3; 165/80.3; 165/185; 29/890.03
(58) Field of Search .............................. 361/690, 703, 361/704, 707, 709–710; 174/16.1, 16.3; 165/80.3, 185; 29/890.03

(56) References Cited

U.S. PATENT DOCUMENTS

| | | | | |
|---|---|---|---|---|
| 5,299,090 A | * | 3/1994 | Brady et al. ................. | 361/703 |
| 5,353,865 A | * | 10/1994 | Adiutori et al. ............ | 165/133 |
| 5,486,981 A | * | 1/1996 | Blomquist ................... | 361/704 |
| 5,933,324 A | * | 8/1999 | Barrett ........................ | 361/703 |
| 6,025,643 A | * | 2/2000 | Auger .......................... | 257/706 |
| 6,244,331 B1 | * | 6/2001 | Budelman .................. | 165/80.3 |
| 6,390,181 B1 | * | 5/2002 | Hall et al. .................. | 165/80.3 |
| 6,611,660 B1 | * | 8/2003 | Sagal .......................... | 392/497 |

* cited by examiner

Primary Examiner—Boris Chervinsky
(74) Attorney, Agent, or Firm—Robert W. Pitts

(57) ABSTRACT

A pin fin heat sink for use in transferring heat away from a heat generating source is described which is manufactured by fusion or stud welding of fins to a base forming a continuous thermally conductive path for heat rejection. The method permits use of a broader range of thermally conductive materials, fin geometry and fin spacing than exists in current art. Having greater flexibility in fin design enables more efficient heat sinks with greater surface area and lower thermal resistance for any given volume. Relatively long thin pins are joined autogenously to a heat sink base with closely spaced adjacent surfaces by a capacitor discharge stud welding process without the need to apply significant force to the mating parts.

14 Claims, 14 Drawing Sheets

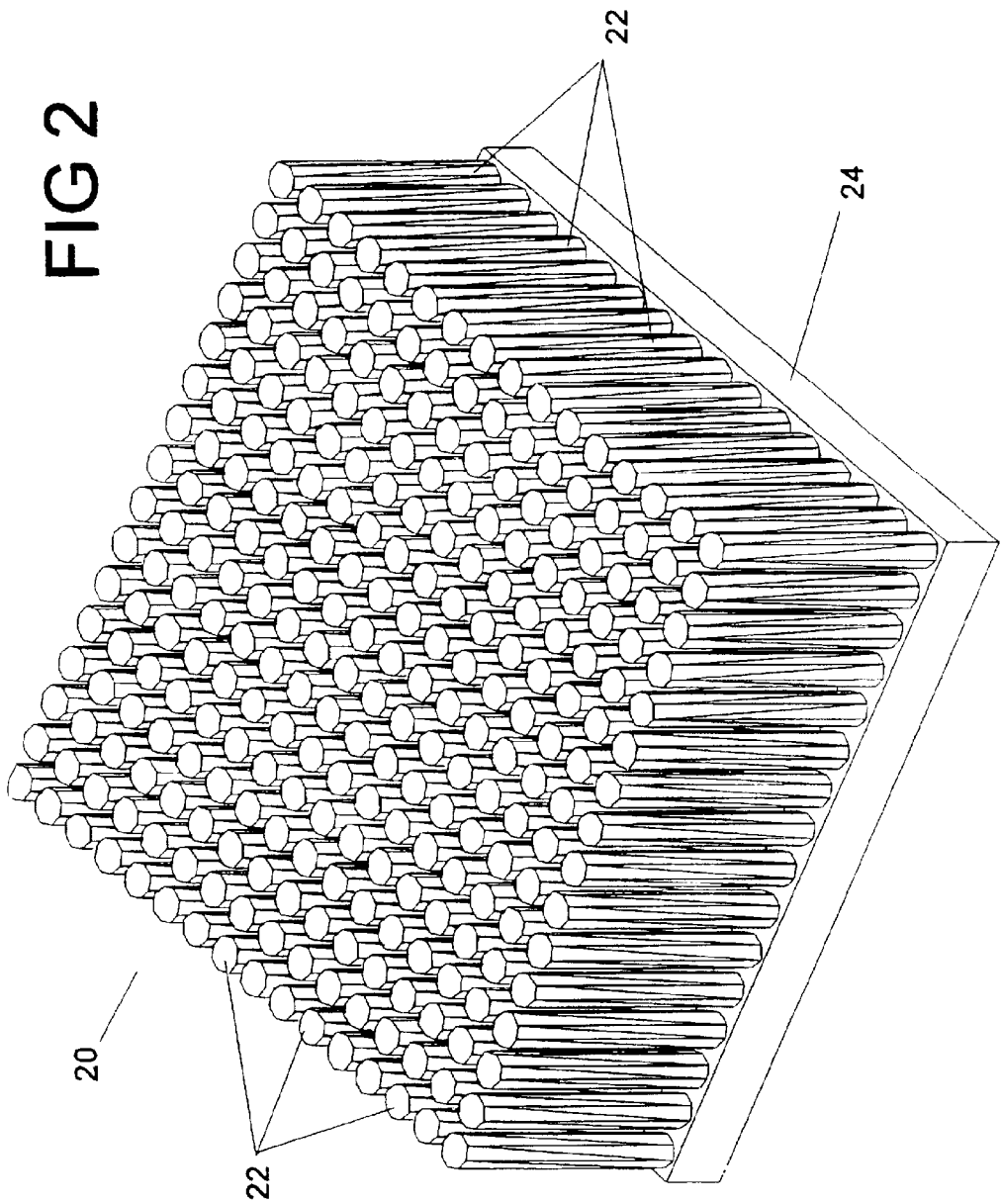

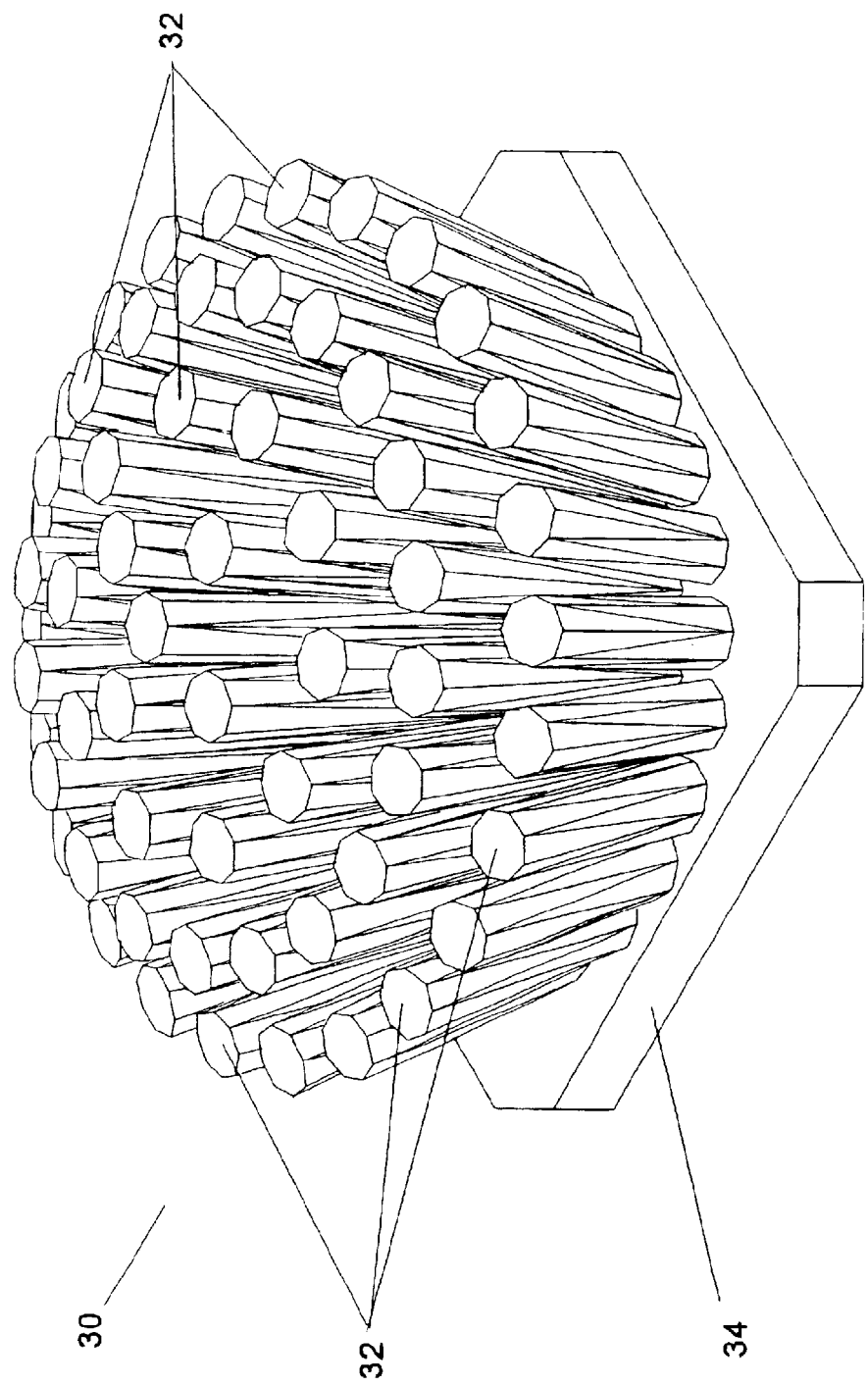

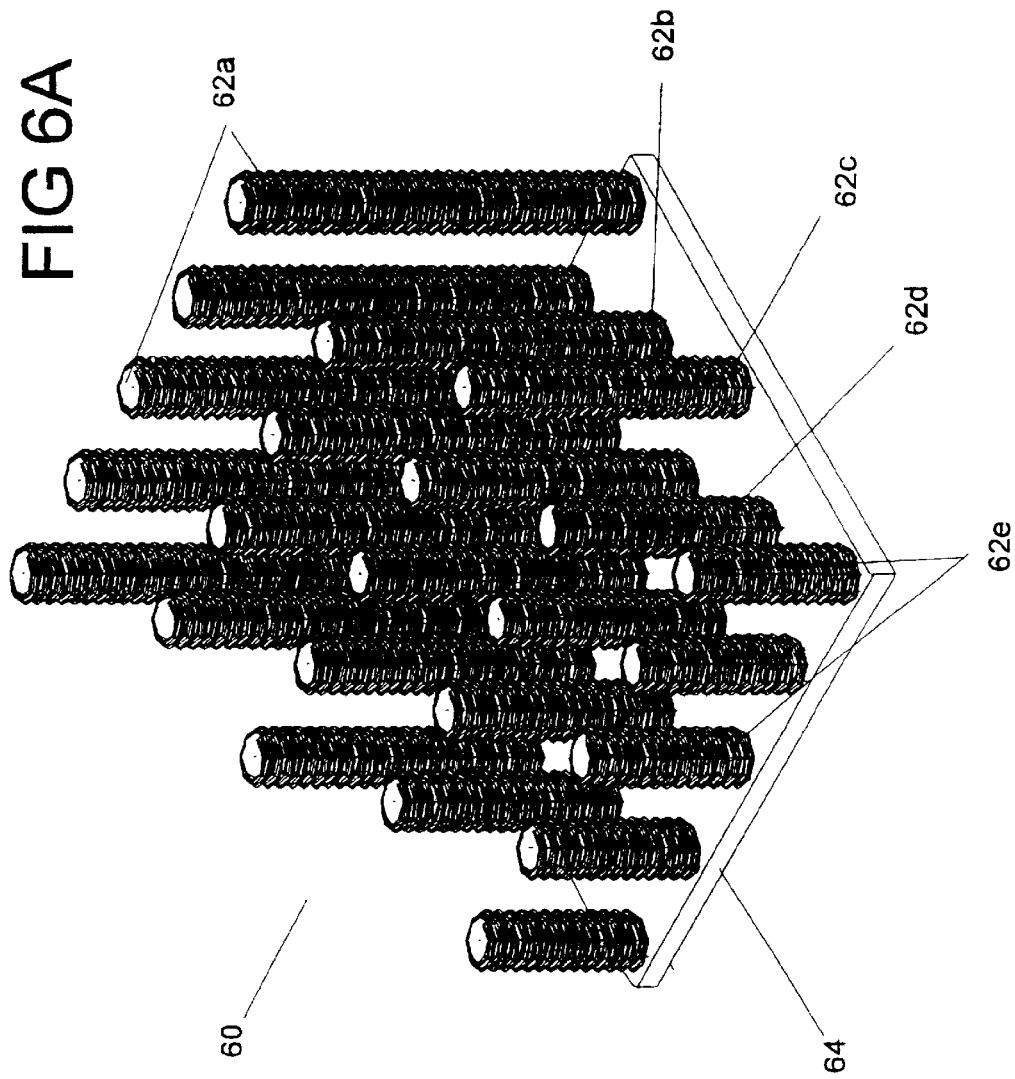

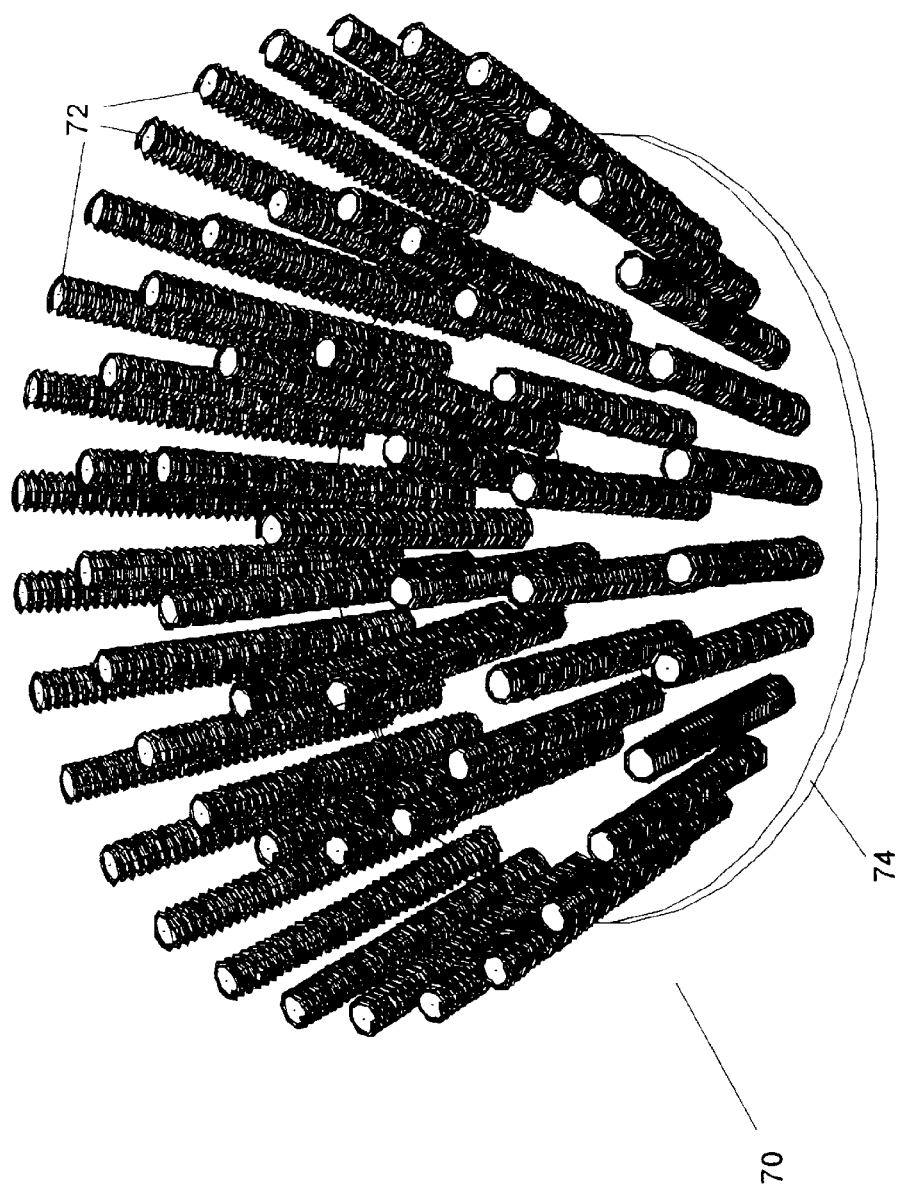

STUD WELDED PIN FIN HEAT SINK

CROSS REFERENCE TO PRIOR PROVISIONAL APPLICATION

This application is a continuation in part of prior patent application Ser. No. 09/467,777 filed Dec. 20, 1999 now abandoned and claims benefit of prior Provisional Patent Application entitled Pin Fin Heat Sink, Method of Manufacture, Ser. No. 60/114,054 filed Dec. 28, 1998 in the name of James Lawrence Dale.

BACKGROUND OF THE INVENTION

1. Field of the Invention

This invention is related to pin fin heat sinks of the type that are used to transfer heat away from a component to the surrounding atmosphere. This invention is specifically related to heat sinks that are used to cool integrated circuit components, but the device and method are also applicable to pin fin heat sinks that are used with other electronic or electrical components, such as multi-chip modules, transformers and power supplies.

2. Description of the Prior Art

Currently pin fin heat sinks are produced by extrusion, casting and metal removal (ie: machining) processes. Each of these processes constrains the heat sink designer by limiting the geometry and material combinations that can be achieved within a given volume. Manufacturers such as Wakefield Engineering Inc., Thermalloy Inc. and Aavid Thermal Technologies produce large quantities of these devices that are used primarily in the electronics industry to cool PC board mounted devices such as microprocessors. Without heat sinks to carry heat away, these devices would suffer high rates of failure. With the relentless trend toward higher density electronic assemblies coupled with smaller high power dissipating devices the need for optimum heat sink performance is greater than ever. The heat sink designer seeks to optimize heat transfer by generating designs having the largest hA product within the volume permitted, where h is the convection heat transfer coefficient and A is the wetted surface area.

Pin Fin Surface Area

Commonly the cross sections of extruded and machined pin fin heat sinks are rectangular and have two opposing sides formed from the extrusion process and two additional sides formed by a metal removal process such as gang sawing, milling or punching, as shown in U.S. Pat. No. 5,572,789. If the rectangular cross-section is instead longitudinally fluted, the wetted surface area can be increased. Currently produced cast heat sinks commonly provide smooth cylindrical or conical fins. If cylindrical or conical fins have threads formed on the outer surface, wetted area can be increased and the non-smooth thread surface may promote mixing of the fluid flow and thus improve performance.

Pin Fin Spacing

Fin spacing is the distance between the surfaces of any two adjacent fins. It can also be thought of as the width of air channel between fins. Machined, cast and extruded pin fin heat sinks are limited in their fin spacing to approximately 2 mm. This limitation is imposed by tool breakage problems that arise when narrower gaps are attempted. This limitation imposes an obstacle for the heat sink designer who may wish to reduce the gap depending on air flow expectations. Reduction of the gap permits denser fin spacing thereby increasing overall pin fin heat sink surface area and in some conditions o fair flow increased heat transfer performace. The method described below allows a smaller fin to fin gap than can be achieved in conventional processes. This close spacing of fins may be especially beneficial when fins of non-constant cross section (eg: spherical) are employed. Additionally, fins need not be located in rectangular arrays but can be positioned arbitrarily if the designer so chooses. Fin spacing flexibility allowing narrow channel designs enables the designer more freedom to enhance h, the convection heat transfer coefficient.

Pin Fin Material

Most commonly used in conventional heat sinks are metallic extrusion and casting alloys which are tailored for their particular process but which exhibit less than optimum thermal characteristics. Typically purer metals possess superior thermal conductivity than their alloyed cousins. Using the method described below practically any pure metal or alloy can be used as a fin material. The only criteria required for fin and base material use is weldability. Even dissimilar base and fin materials can be successfully joined. While heat sinks are typically convection limited, a high thermal conductivity of the heat sink structure will beneficially effect overall heat transfer. Conversely, if conductivity of the fin/base joint is lower than parent metal as when the joint is prepared by soldering or brazing or swaging, overall performance may be diminished.

Pin Fin Length

Extruded and cast pin fin heat sinks commonly have pins exhibiting a height to pin spacing ratio of less than 10 to 1, as shown in U.S. Pat. Nos. 4,879,891 and 4,884,331. Process limitations prevent larger ratios. The method described below can achieve pin fin height to spacing ratios that are orders of magnitude greater than those seen in conventional heat sinks. Larger ratios free the heat sink engineer to create more efficient new designs. Longer fins are generally preferred in natural convection circumstances. Fin length may affect both parameters, h and A.

Pin Fin Thickness

Pin fin thicknesses in conventionally manufactured heat sinks range down to approximately 2 mm. In the new method fin thickness can be reduced significantly to approximately 0.25 mm. Greater flexibility in choosing fin thickness provides an advantage in achieving maximum heat transfer.

Pin Fin Orientation

Conventional pin fin heat sink fin axes are parallel, as mandated by the processes employed in their manufacture. The method described below permits non-parallel fin axes and consequently highly variable fin spacings in heat sinks.

Base Thickness

Conventional pin fin heat sink bases are relatively thick compared to fin thickness. The thicknesses that occur are required to some extent by the method of manufacture. However, optimum thermal performance may call for thinner bases to minimize thermal resistance. The method described below permits base thickness to be reduced to approximately 0.25 mm, thus it is possible to weld fins directly onto an exposed copper layer of a PC board itself.

SUMMARY OF THE INVENTION

The invention described herein would be suitable for use with pin fins and pin fin configurations that would have superior heat transfer characteristics relative to conventional pin fin heat sinks that are produced by such methods as extrusion, casting or material removal.

The method described below permits the use of cylindrical and spherical fins as well as pin fins having a wide variety of constant (eg: cylindrical, elliptical, fluted) and non-constant cross sections (eg: spherical, knurled, helical, and tapered). For example this invention could be employed with pins having helical grooves or threads extending around the periphery of the pins.

A pin fin heat sink according to this invention includes a base with a plurality of pins extending from the base. Each pin is joined to the base by an autogenous stud weld. The stud weld forms a continuous weld layer formed from material contributed by the pin and material contributed by the base and extends over a complete cross section of the pin to join each pin to the base. The pin is welded to the base by joining molten material from an end of each pin and from the portion of the base adjacent the end of the pin after which the molten material solidifies to form the continuous weld layer.

In the method of fabricating a pin fin heat sink, individual pins are sequentially positioned adjacent a base. A voltage difference is then applied between individual pins and the base sufficient to cause an arc between the pin and the base to melt ends of pins adjacent the base and to melt portions of the base adjacent pins so that the pins are welded to the base.

BRIEF DESCRIPTION OF THE DRAWINGS

FIG. 2 is a view of a 16×16 array of cylindrical pins welded to a base to form a heat sink that could be used with an integrated circuit device.

FIG. 3 is a view of a pin fin heat sink with which the pins are welded to the base in a configuration in which the pins diffuse with distance from the base to increase the exposure of the pins to the surrounding atmosphere to improve heat transfer.

FIGS. 6A and 6B and 7A and 7B show pin fin heat sinks that use threaded pins welded to a base.

FIGS. 6A and 6B show a pin fin heat sink in which adjacent rows of pins have different heights which serves to mitigate inefficiencies arising from flow bypass over the front most rows of fins.

FIGS. 7A and 7B show a pin fin heat sink in which threaded pins are welded to a domed or semispherical base so that the pins will extend generally perpendicularly or radially relative to the base surface, but will also diverge so that a greater volume of air will be exposed to a larger pin surface area to increase heat transfer away from a device to be cooled.

DETAILED DESCRIPTION OF THE PREFERRED EMBODIMENT

Stud Welding

Figure 1A:
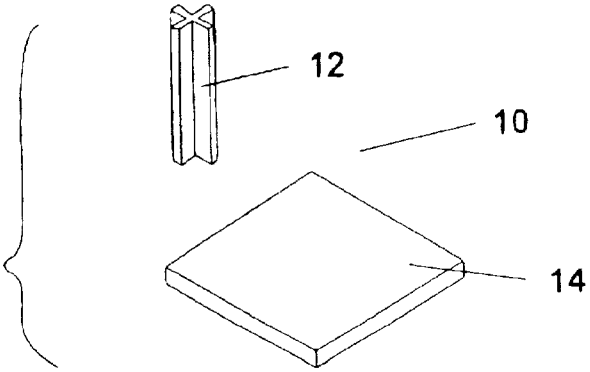
FIGS. 1A, 1B and 1C are schematic views showing the basic steps of stud welding pins to a base to form a pin fin heat sink.

Various stud welding processes are commonly available. They include arc welding, drawn arc welding, capacitive discharge welding and resistance welding. A brief description of each is given below. The specific process chosen for the method described below will depend upon base thickness, equipment cost, equipment accuracy, ability to automate and fin spacing. Stud welds are characterized by one side access, autogenous (ie: no filler), no special joint preparation other than cleaning and weld flash due the expulsion of weld metal from the core of the heat affected zone.

Arc Welding

A controlled electric arc is used to melt the end of the stud and a portion of the base metal. The stud is thrust automatically into the molten metal and a high quality fusion weld is accomplished. Conventional DC welding machines of all types can be used, but special power units designed for stud welding are available and produce the best results. Manufacturers of arc welding equipment include Alpha Stud Weld Inc. and PRO WELD International.

Drawn Arc Welding

A welding rectifier serves as an energy source and provides a continuous welding current which is adjustable with regard to time and intensity of current. When a controller automatically releases the main welding current a pool of molten metal is formed at the end of the stud and on the proximal base. The controller then de-energizes current and advances the stud into the molten metal. The metal solidifies into a homogeneous fusion weld. A variation of this process is the short cycle drawn arc. Manufacturers of drawn arc welding equipment include EMHART Fastening Teknologies and TRW.

Capacitive Discharge Welding

A bank of capacitors is charged and a controller accelerates the stud toward the base material. A specially designed nib on the stud contacts the base and short circuits the capacitors. The nib is vaporized and a plasma arc jumps between stud and base, the arc melts a pool of interposing metal and when impact of stud occurs a fusion weld is created. Variations of capacitive discharge stud welding processes include Initial Gap, Initial Contact and Drawn Arc. Manufacturers of capacitive discharge welding equipment include Contract Fusion Inc. and SOYER Resistance Welding The stud and base are joined by passing current between electrodes positioned on opposite sides of the pieces being welded. The resistance of the metal to current flow causes heating of the metal until fusion occurs. Manufacturers of this type of equipment include LENCO Welding Products and CMW Inc.

Description of the Method

A highly flexible method is described here that can be used to mass produce pin fin heat sinks that are more efficient than those produced by prior art. The steps taken to manufacture the pin fin heat sink are as follows:

a) Individual fins are formed utilizing weldable wire or bar of arbitrary cross section in headers (hot or cold) or automatic lathes (eg: screw machines) to establish fin length, surface and end conditions. Crude fins can be produced by simply sawing or shearing a section of the material. Spherical fins are purchased from companies such as Salem Specialty Ball Company,Inc.

b) A base is created by punching or shearing or sawing or laser cutting or water jet cutting the desired area out of weldable sheet or plate or bar or extrusion. A weldable casting could also be used for the base.

c) Each fin is joined to the base in a predetermined location and orientation by means of fusion welding (ie: stud welding). Subsequent fins are positioned manually or automatically by movable fixtures or weld heads, which establish the desired fin pattern. The fins are stitched into place one by one at a rapid rate of approximately 20 fins per minute per weld head. The resulting welded interface at each fin is metallurgically and structurally sound and continuous.

d) The external surfaces of the heat sink are surface treated. Surface treatment is performed on heat sink surfaces to improve thermal radiation properties and for cosmetic reasons. Treatments such as anodizing, chromating, painting and plating are typical.

Pin Fin Heat Sink Embodiments

Figure 1B:
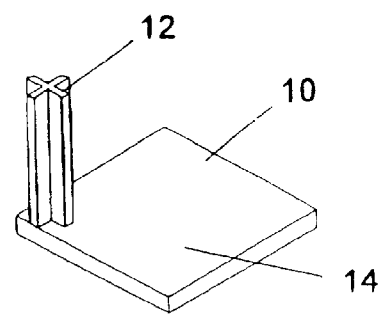
Figure 1C:
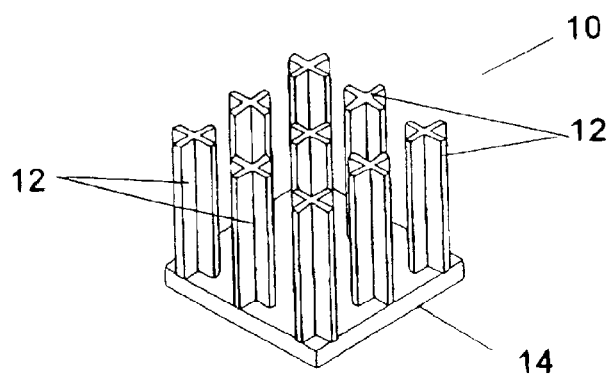

FIGS. 1A, 1B and 1C are schematic view showing the basic steps for fabricating a pin fin heat sink 10 comprising a plurality of pins 12 that are welded to a base 14. In the representative embodiment shown in FIG. 1A, the pins 12 have a cruciform cross section. The pins 12 are placed in close proximity to the base 14 in sequential fashion and each pin is welded to the base 14. When each pin is positioned sufficiently close to the base an electrical arc melts both the bottom surface of the pin 12 and the adjacent portion of the base 14. A weld layer is thus formed as the molten material from the pin and base solidify to secure the pin 12 to the base 14. Additional pins 12 can be welded in the same manner and adjacent pins can be closely spaced, for example with the distance between adjacent pin surfaces being approximately equal to 0.5 mm.

FIG. 2 shows a narrow channel 16×16 pin array in which cylindrical pins 22 are welded to a base 24 to form a pin fin heat sink 20. Each of the pins 22 is intended to have a circular cross section so that each pin is in the form of a right circular cylinder. The cross sectional shape of the pins 22 differ slightly from a true circle because of the restrictions inherent in the graphic model used to construct this drawing. However, other noncircular cross sections can be employed. The cross sectional configuration of the pins will comprise a compromise between manufacturing considerations for making the pins themselves and the heat transfer effects which are to be achieved by the pin fin configuration. The cross sectional shape of the individual pins should not however significantly affect the character of the stud weld between the pins 22 and the base 24. A typical example of a pin fin heat sink of this type that could be used to cool an integrated circuit component would employ 256 pins spaced closely together, interspersed above the integrated circuit component in a area having dimensions of 50 mm×50 mm.

FIG. 3 shows a pin fin heat sink 30 configuration in which the pins 32 mutually diverge with increasing distance away from the base 34. This increases the spacing between the pins 32 and therefore increase the exposure of the pins to the atmosphere while the footprint of the base 34 in not increased. The lower surface of the majority of these pins 32 do not extend perpendicular to the axis of the pins 32, and the pins are not oriented perpendicular to the flat upper surface of the base 34 to which the pins 32 are welded. The pins 32 can be stud welded to the base 34 even though each pin is not held at right angles relative to the base when the pin is stud welded to the base.

Figure 4:
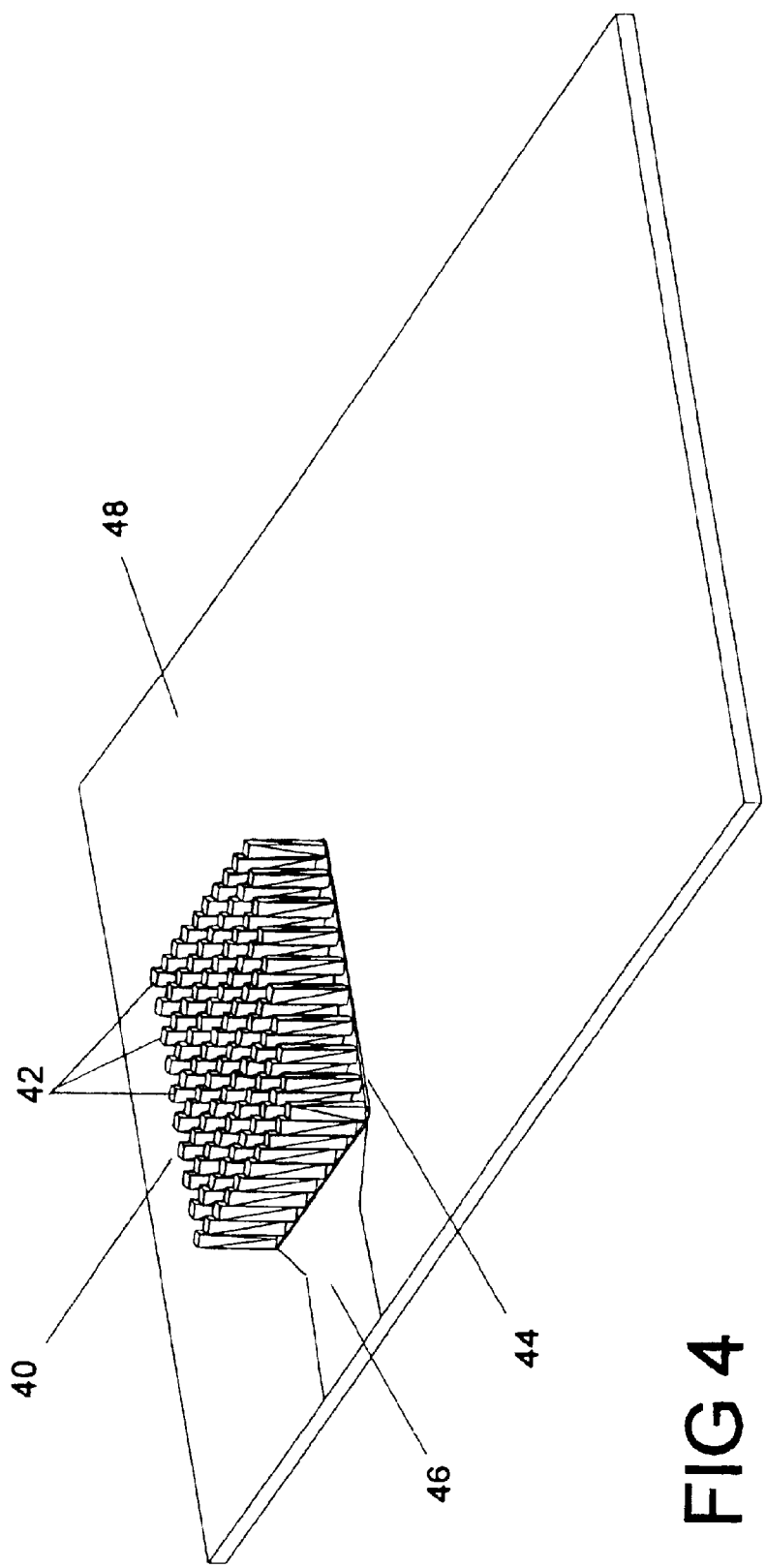
FIG. 4 is a view of a pin fin heat sink welded directly to a pad on a printed circuit board.

FIG. 4 shows another advantage of stud welding the pins 42 to a base 44 to form a pin fin heat sink 40 that is welded directly to a printed circuit board 48. The base 44 comprises a pad portion, approximately 0.25 mm thick, of a printed circuit board trace 46. The pins 42 are sequentially stud welded directly to the base or printed circuit board pad 46 with material forming the trace 46 being melted and forming a part of the weld layer connecting the pins 42 directly to the pad 44.

Figure 5:
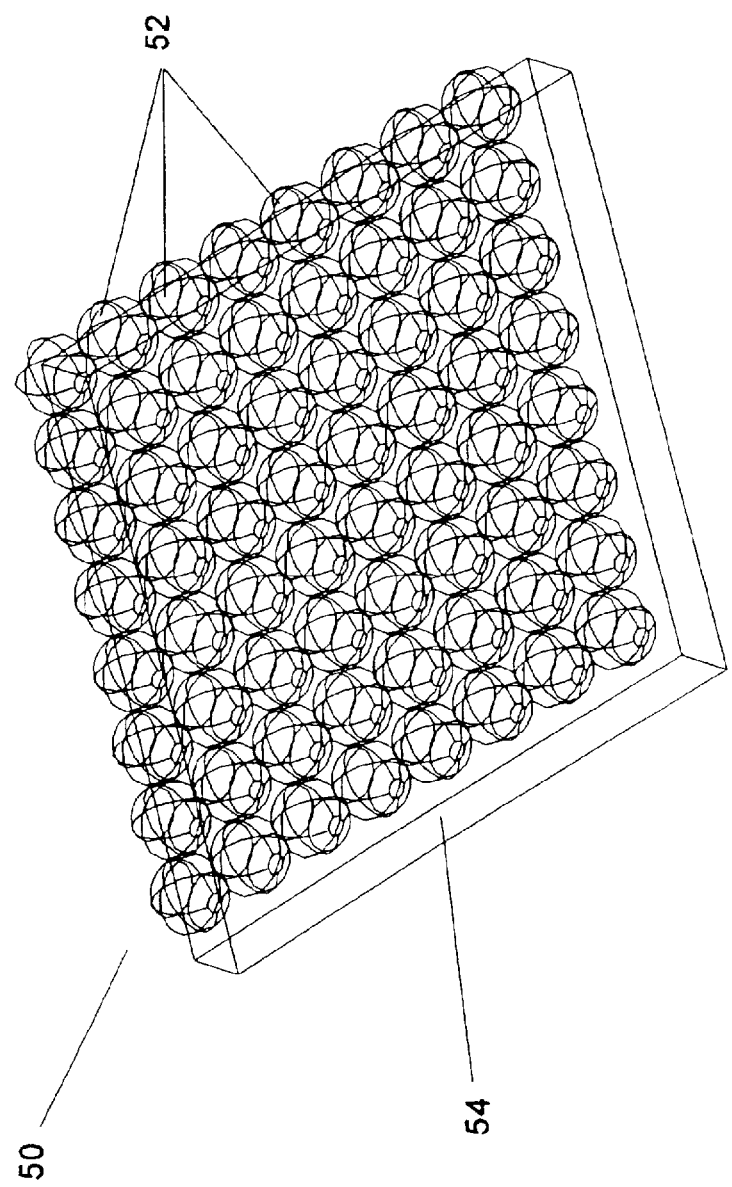
FIG. 5 is a view of a heat sink in which the pins are generally spherical in configuration.

FIG. 5 is another configuration in which the heat sink 50 comprises a plurality of substantially spherical members 52 stud welded to the base 54. Each spherical member 52 does have a generally flat surface, which is also welded to the flat continuous top surface of the base 54. This configuration would be especially useful where the height of the heat sink may be limited, but larger pin surface area is still needed.

FIGS. 6A, 6B, 7A and 7B all show pin fin heat sinks in which the pins have helical threads extending around the periphery of each pin so that a larger surface area is exposed to the surrounding atmosphere or the air flowing around the pins. In addition to showing the use of staggered pin configurations in FIGS. 6A and 6B and the use of domed pin radiating configurations shown in FIGS. 7A and 7B, these views also show the use of threads or helical grooves on the periphery of the pins to increase the exposed surface area of the pins. Individual threaded pins can be easily and inexpensively fabricated by screw machining or heading. One example of threaded pins that could be used in this manner possesses a 4–40 UNC thread form.

Figure 6B:
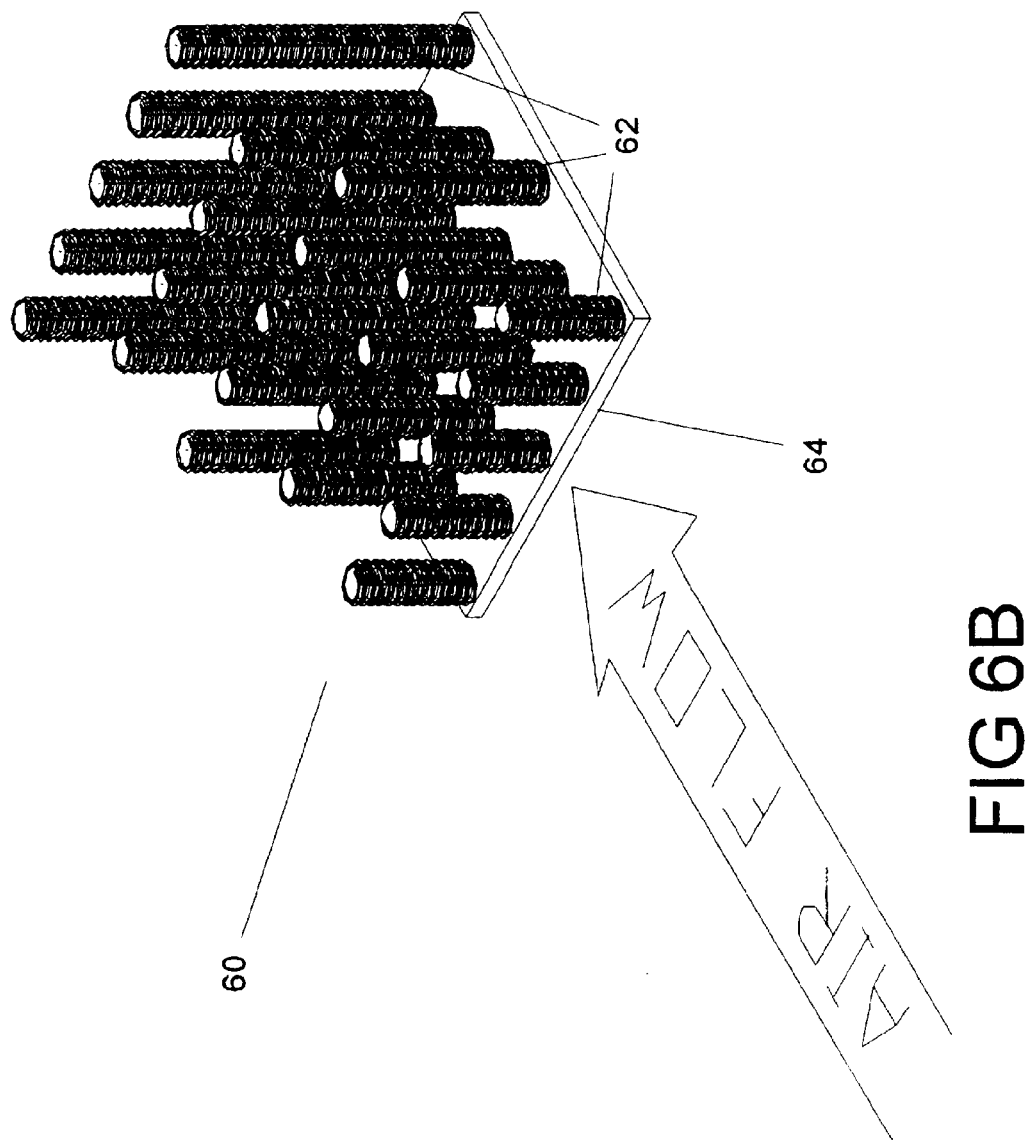

FIGS. 6A and 6B show a pin fin heat sink 60 in which threaded pins in each successive row are taller than the pins in the previous row of pins. The tallest pins 62a are located in a rear row with pins 62b, 62c, 62d and 62e each being shorter than the pins in the row immediately to its rear. All of the pins are, however, stud welded to the same base 64. This pin fin heat sink 60 is of particular value when used in conjunction with a forced air current or air flow. As shown in FIG. 6b the air flow would pass over the shorter pins first and then successively over the taller pins to its rear. Thus at least a portion of the tallest pins at the rear of the heat sink 60, in reference to the air flow, are exposed to the air flow and can convectively transfer heat to this air flow. It has been found that in some configurations with pins in all rows having approximately the same height that choke flow can result and none of the air flow will pass closely adjacent to the pins in the rear rows. Thus the heat transfer efficiency of the rear pins of conventional heat sinks is adversely affected and heat transfer is not evenly distributed over the entire heat sink. The sequential stud welding fabrication method of this invention facilitates assembly of a heat sink with pins 62 having different heights.

The pins 62 in adjacent rows of heat sink 60 are also transversely staggered relative to the pins in the two adjacent rows. This will also expose the pins more effectively to the air flow. The staggered configuration of pins in adjacent rows, and the use of pins having different heights are also not limited to pins having the threaded pin 62 shown in FIGS. 6A and 6B.

Figure 7A:
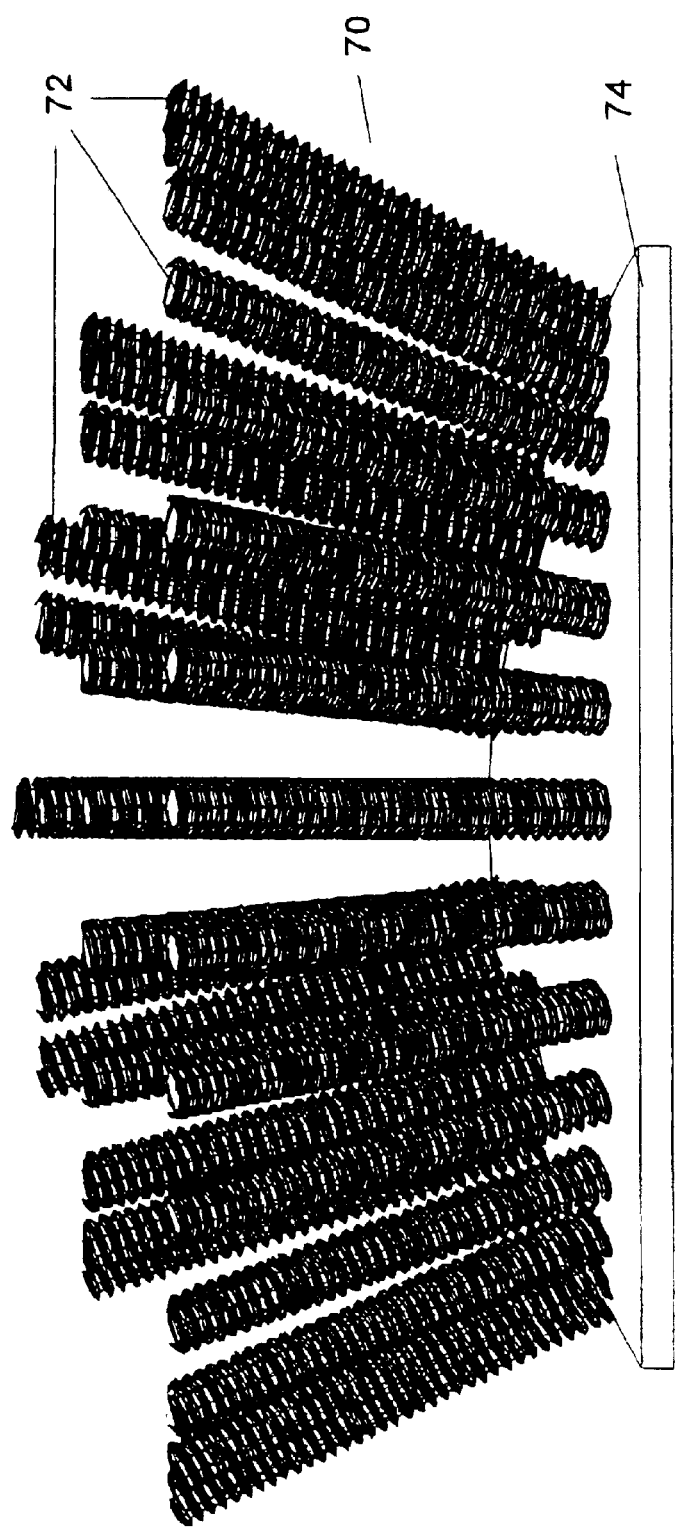

FIGS. 7A and 7B show a configuration in which threaded pins 72 are stud welded to a dome base 74 which has an continuous curved upper surface. The dome base 74 has the shape of an upper portion a sphere and the flat lower surface of the dome 74 has substantially the shape of a plane extending through a sphere to form the dome 74. The flat lower surface of the dome 74 could be positioned flush with the device to be cooled. The pins 72 could then be stud welded to the curved upper surface of the dome 74. The pins 72 would then be locally perpendicular to the continuous curved surface of the dome 74, but would then diverge as the pins 72 extend away from the base 74. Each of the pins 72 would be identical with the other pins and the lower surfaces of the pins 72 would not have to cut as an particular angle depending upon its position as for the configuration shown in FIG. 3.

Figure 8:
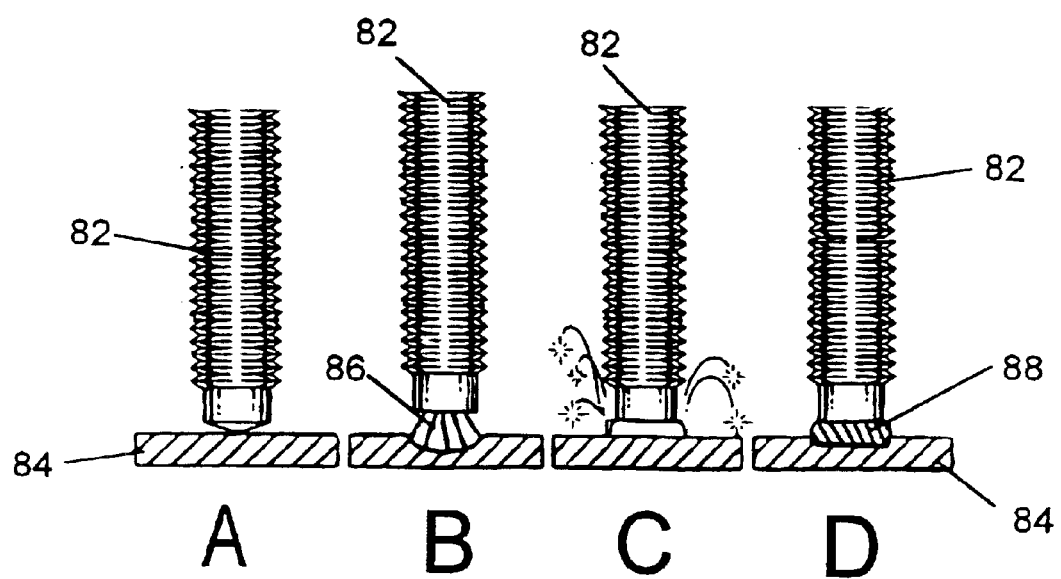
FIGS. 8A through 8D shown the manner in which individual pins are stud welded to the base.

FIGS. 8A–D show the manner in which the pins, here represented by threaded pins 82 are stud welded to the base 84. As shown in FIG. 8A, a pin 82 which forms one of the electrodes is first positioned against the base 84 which forms the other electrode. In the case of drawn arc stud welding, pin 82 is then withdrawn as shown in FIG. 8B and the pin electrode 82 is energized creating a significant potential difference between the initially protruding end of the pin and the base 82. An arc 86 is generated by this potential difference and this arc melts at least a portion of the end of the pin 82 and the adjacent area of the base 84 creating a pool of molten metal which then solidifies to form a weld layer 88 between the pin 82 and the base 84. The weld metal is expelled from the center of the weld zone to form a flash thereby distinguishing the joint from other welding processes where a filler metal is externally added to create a fillet observable at the interface. This weld layer intermixes material from both the pin 82 and the base 84 so that the pin 82 is fused to the base 84 creating a continuous weld layer 88 that is shown in section in FIG. 8D. This fused weld layer provides good heat transfer from the base 84 to the pin 82, since there is no intervening layer, such as an adhesive layer, that would have lower heat conductivity that the metal pin 82 and the metal base 84. Furthermore, this stud weld can be formed without the need to apply force to long thin pins as would be required if mechanical connection of the pins to the base was accomplished by swaging, friction welding or similar purely mechanical operations.

By using the pin 82 as an electrode in a stud welding process it is also not necessary to apply a separate material to form the weld, an operation that would be difficult for closely spaced pins in a pin fin heat sink. In some cases it may be necessary to introduce a sleeve or ferrule between closely spaced pins 82 to prevent arcing between the energized pin and closely adjacent electrodes. However, since the pin 82 would not be energized until it was positioned adjacent to the base, forming a small gap that is less than the spacing between adjacent pins, this step would not be necessary in most cases.

The pins 82 utilized for pin fin heat sinks of this type would also normally be formed of metals, such as copper, copper alloys or aluminum, which are good electrical conductors, further reducing the likelihood of arcing between pins. In other cases it may also be necessary to use a knock off pin in which an upper breakaway section would be gripped by a collet, which forms not only the mechanical attachment of the pin to the stud welding apparatus, but also forms the electrical connection. This approach would be used where it would not be possible to satisfactorily grip closely spaced pins. Since the pins are welded one at a time, the breakaway gripping section could be located above the pins where it would not interfere with adjacent pins, and would then be removed before another closely spaced pin was welded. It would also be possible to first attach more widely spaced pins to the base and to use breakaway pins only for inserting pins between previously welded pins, thus reducing material waste that would be introduced by the use of breakaway pins.

The preferred form of stud welding that would be used to fabricate pin fin heat sinks of the type depicted herein would be capacitor discharge stud welding. With this process, the pin melts almost instantly when energy stored in capacitors is discharged through the pin. There are three forms of capacitor discharge stud welding. In the initial gap mode, the pin would be held in place with a gap between the pin and the base. As the pin electrode is energized the pin is plunged into the molten materials formed by the arc forming a strong bond between the pin and the base. The weld cycle time for welding each pin to the base is approximately 4 to 6 ms. In the initial contact mode the tip of the pin is initially in contact with the base. The current surge disintegrates the pin tip melting the pin face area and the adjacent surface of the base. The pin is then pushed into the molten material forming a strong homogeneous weld extending continuously between the interface of the pin and the base. The weld cycle time for welding one pin to the base is approximately 6 ms. In a drawn arc process, the pin is initially held in contact with the base as the current surge is applied. The pin is then retracted drawing the arc that melts the tip of the pin and the base surface directly below the pin tip. The stud is then plunged into the molten material. Although the weld cycle time may be longer, the heat-affected zone is thicker than for the other processes.

Although capacitor discharge welding is the preferred method of joining the pins to the base, as previously discussed other forms of arc welding can be employed. In addition, in some cases it may be possible to use resistance welding.

Although the pins would be stud welded to the base one at a time, this process could be automated using CNC controlled automatic stud welding equipment. A welding head would be positioned by an NC table system and the pins would be automatically stitched to the base. The pins would be automatically fed to the welding head. By employing this approach the pin fin heat sink could be fabricated in approximately the same time as would be required by a conventional pin fin heat sink that does not offer the advantages of the devices depicted in the representative embodiments of the invention depicted herein and of other equivalent embodiments defined by the claims presented herein.

Description of a Typical Use of the Pin Fin Heat Sink

Although pin fin heat sinks in accordance with this invention can be employed in a number of different applications, one important use of this type of device is to conduct heat away from electronic components, such as an integrated circuit device. FIGS. 9–12 show the use of a stud welded pin fin heat sink 90 to conduct heat away from an integrated circuit device 100 that is mounted on a printed circuit board 142. The integrated circuit device 100 is merely representative of a number of electronic devices of this type, especially electronic devices that are mounted on printed circuit boards.

The integrated circuit device 100 has a flat upper surface that is typical of devices of this type. Integrated circuit device 100 also has a plurality of leads that are soldered to the printed circuit boards. The traces and surface mount pads on the printed circuit board 104 are of conventional construction and would appear rather small if shown on FIG. 9. Therefore the printed circuit board traces and pads have been omitted for the sake of clarity.

The stud welded pin fin heat sink 90 has pins 92 stud welded to the flat base 94. Pin fin heat sink base 94 has a flat lower surface that will conform to the flat upper surface of the integrated circuit device 100, and the base 94 will be in contact with the device upper surface over substantially all of the exposed upper area. Thus heat can be efficiently conducted from the integrated circuit device 100 to the pin fin heat base 94 and then to the plurality of pins 92 stud welded in close proximity to the upper surface of the base 94. The threaded configuration of the closely spaced stud welded pins 92 will provide a relatively large surface area to transfer heat to the surrounding air or other fluids in which this assembly is used.

Figure 9:
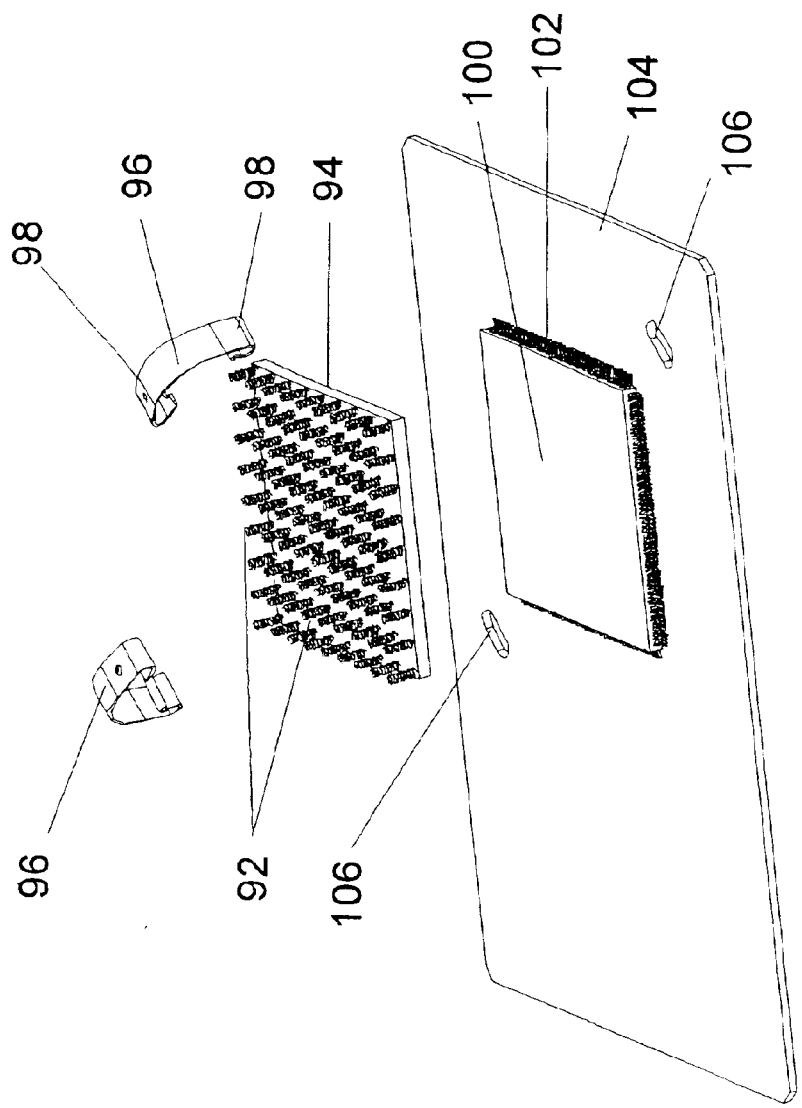
FIG. 9 is an exploded view of a pin fin heat sink and mounting clips that can be used to position the pin fin heat sink in contact with an integrated circuit device on a printed circuit board.
Figure 10:
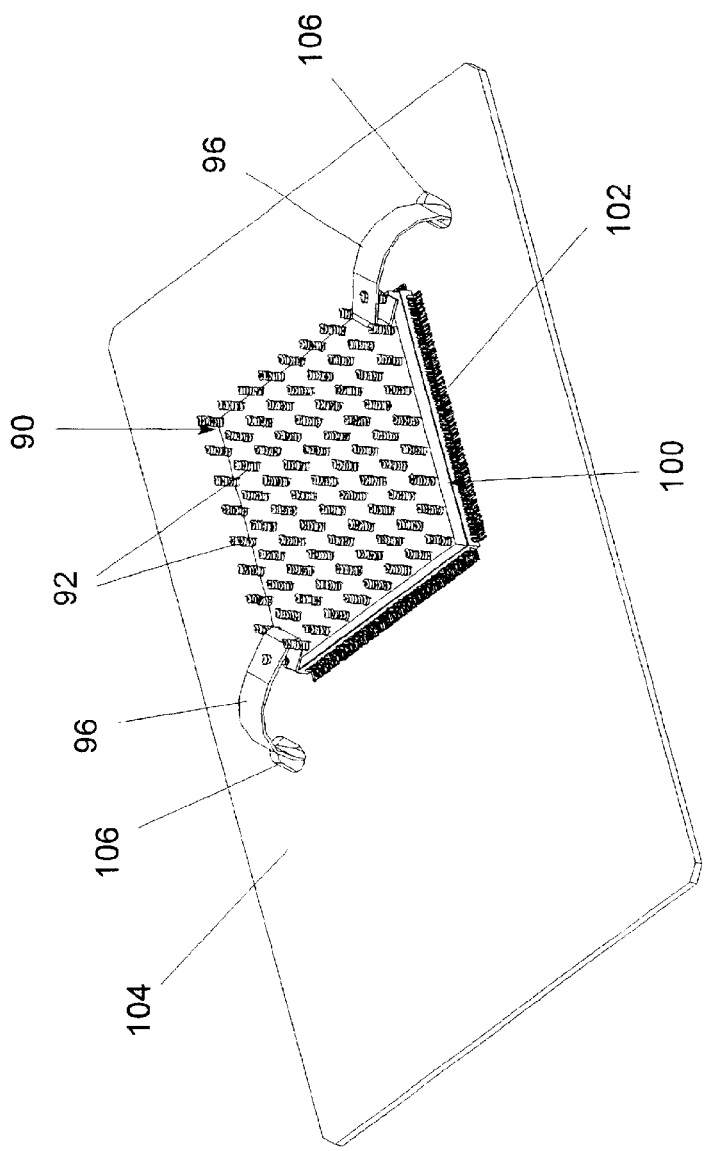
FIG. 10 is a three dimensional view of the pin fin heat sink of FIG. 9 mounted on the integrated circuit device and secured to the printed circuit board by spring mounting clips.
Figure 11:
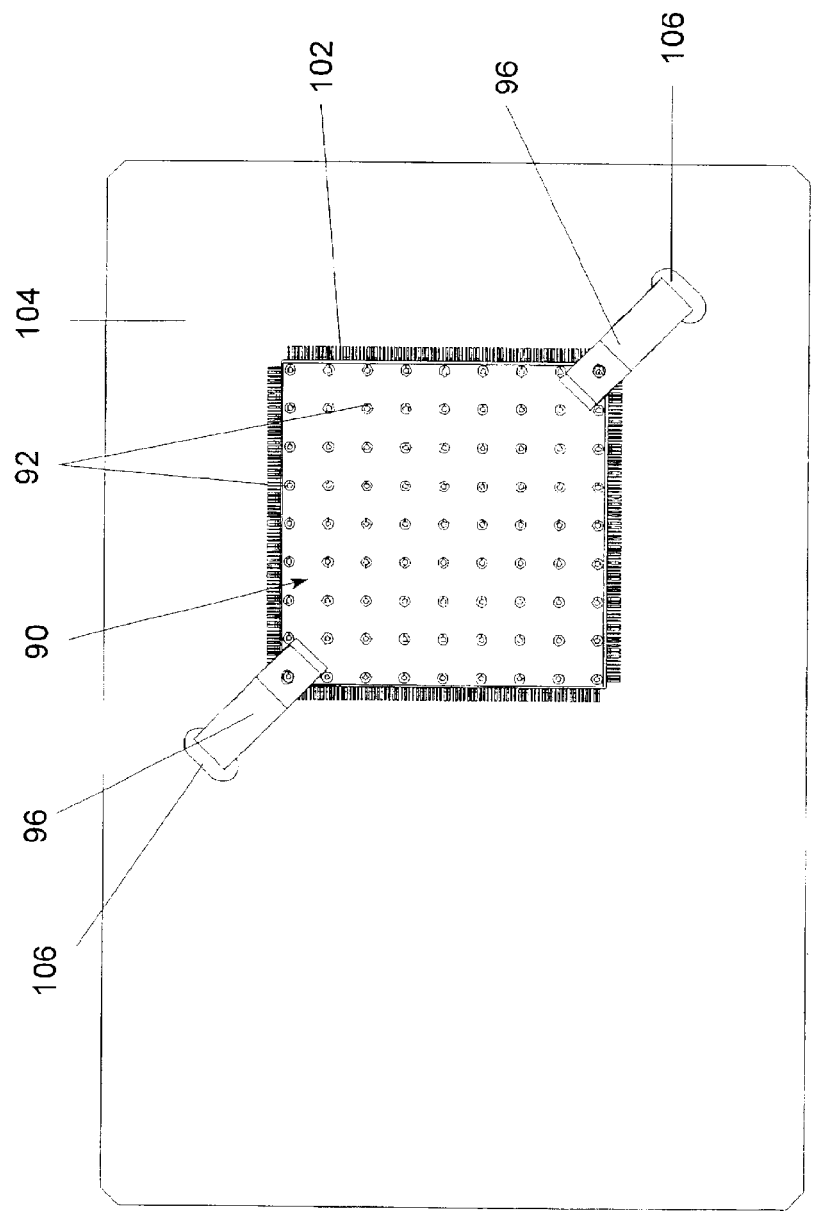
FIG. 11 is a plan view of the pin fin heat sink mounted on the integrated circuit device and on the printed circuit board also shown in FIG. 10.
Figure 12:
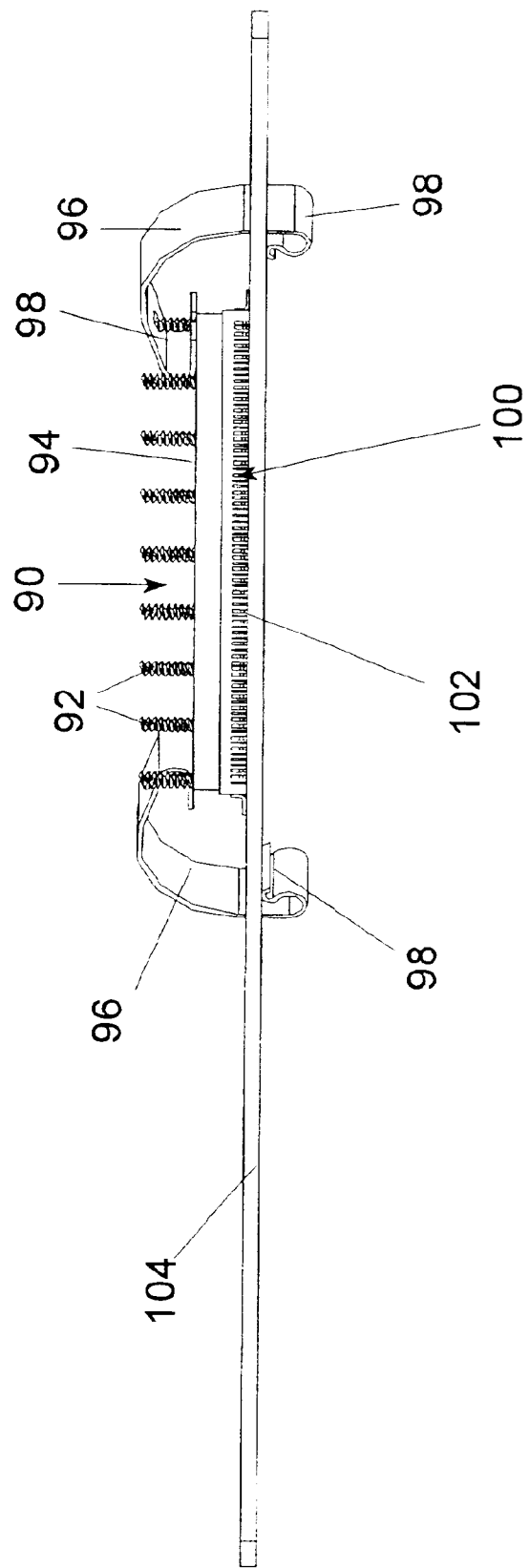
FIG. 12 is a side view of the assembly also shown in FIGS. 10 and 11.

The stud welded pin fin heat sink 90 can be mounted and secured to the integrated circuit device 100 and to the printed circuit board 104 in a number of ways. In the representative embodiment of FIGS. 9–12 two metal spring clips 96 are used to secure diagonally opposite corners of the stud welded pin fin heat sink 90 to the printed circuit board 104. These mounting clips 96 are elastically deformable and can be made of a material such as spring steel. Mounting clips 96 serve to provide a compressive force between the heat sink 90 and the top surface of the integrated circuit component 100. In this representative embodiment, slots 106 extend through the printed circuit board 104. These slots 106 are located adjacent opposite corners of the integrated circuit device 100, and each slot 106 is large enough so that a mounting clip 96 can be inserted through the slot 106. The opposite ends 98 of the clips 96 are reversly formed so that the clip ends 98 will engage either the bottom of the printed circuit board 104 or the top surface of the stud welded pin fin heat sink 90. The clips 90 can engage both the upper surface of the pin fin heat sink base 94 and the edges of the routed printed circuit board holes 106 through which they extend. One end of the clips 96 also has a hole so that a corner pin 92 can be inserted into this hole when the clip 96 is attached to the heat sink 90, and so that the clip 96 can also engage the outer peripheral surface of the pin 92 extending through this hole in the clip. Thus these simple clips 96 will serve not only to secure the heat sink 90 in intimate contact with the integrated circuit device 100, but the clips will also prevent lateral movement of the heat sink 90 relative to the integrated circuit component 100 and relative to the printed circuit board. As shown in FIG. 9, both the clips 96 and the heat sink 90 can be mounted on the printed circuit board after the integrated circuit component has been soldered to the printed circuit board.

The mounting configuration of FIGS. 9–12 is just one example of the ways in which the stud welded pin fin heat sink can be mounted in engagement with an electronic component, such as the integrated circuit component 100. Other mounting arrangements would also be apparent to one of ordinary skill in the art. For example the integrated circuit component could be mounted in a socket and the heat sink could be secured in place by the socket in a conventional manner. The heat sink could also be secured to the printed circuit board by a conventional fastener, such as a screw or bolt. A metal frame could also surround the periphery of the heat sink and this frame could be attached to the printed circuit board at each corner. Indeed one of the advantages of a stud welded pin fin heat sink, such as those shown in the representative embodiments shown herein, can be mounted in contact with the integrated circuit component by any number of conventional means. Therefore the invention is defined by the following claims and is not limited to the representative embodiments depicted herein.

I claim:

1. A pin fin heat sink comprising a base with a plurality of pins extending from the base, each pin being joined to the base by an autogenous stud weld comprising a continuous weld layer formed from material contributed by the pin and material contributed by the base and extending over a complete cross section of the pin to join each pin to the base, the pin being welded to the base by joining molten material from an end of each pin and from the portion of the base adjacent the end of the pin after which the molten material solidifies to form the continuous weld layer, the pin fin heat sink comprising means for cooling an electronic component.

2. The pin fin heat sink of claim 1 wherein the base has a continuous upper surface to which multiple pins are joined.

3. The pin fin heat sink of claim 2 wherein the continuous upper surface is flat.

4. The pin fin heat sink of claim 2 wherein the continuous upper surface is curved.

5. The pin fin heat sink of claim 1 where adjacent pins are spaced apart by a distance no greater than a major cross sectional dimension of at least one of the pins.

6. The pin fin heat sink of claim 1 wherein at least one pin includes a threaded surface extending along the exterior of the pin to increase exposed surface area of the pin for more efficient heat transfer.

7. The pin fin heat sink of claim 1 wherein pins are located in multiple rows with the pins in one row having a height greater than pins in an adjacent row so as to expose taller pins to air flowing through the heat sink to improve heat transfer by eliminating choke flow.

8. The pin fin heat sink of claim 1 wherein the pins diverge from pin ends adjacent the base to pin ends spaced from the base to increase the volume of air flowing past the pins.

9. The pin fin heat sink of claim 8 wherein the pins are welded to a curved surface forming a portion of a spherical surface.

10. The pin fin heat sink of claim 1 wherein the pins are spherical.

11. The pin fin heat sink of claim 1 wherein 256 pins are welded to one surface of a base having an area of 2500 square mm. so that the base comprises means for mounting the pin fin heat sink on an integrated circuit component.

12. The pin fin heat sink of claim 1 wherein the pins and the base are fabricated from different metals.

13. The pin fin heat sink of claim 1 wherein pins in one row are transversely staggered relative to pins in an adjacent row.

14. The pin fin heat sink of claim 1 wherein the base includes a surface engagable by a mounting means to mount the pin fin heat sink on an electronic component.

* * * * *